United States Patent [19]
Kangas et al.

[11] Patent Number: 5,597,677
[45] Date of Patent: Jan. 28, 1997

[54] PHOTOIMAGEABLE ELEMENTS

[75] Inventors: Steven L. Kangas, Woodbury; Emil D. Sprute, Apple Valley; Dean J. Stych, New Brighton, all of Minn.

[73] Assignee: Minnesota Mining and Manufacturing Company, Saint Paul, Minn.

[21] Appl. No.: 333,421

[22] Filed: Nov. 2, 1994

[51] Int. Cl.$^6$ .............................. G03F 7/11; G03F 7/095
[52] U.S. Cl. ...................... 430/273.1; 430/143; 430/156; 430/166; 430/284.1; 430/302; 430/293
[58] Field of Search .................. 430/273.1, 165, 430/166, 284.1, 271.1, 302, 309, 293, 143, 156

[56] References Cited

U.S. PATENT DOCUMENTS

| | | | |
|---|---|---|---|
| Re. 24,906 | 12/1960 | Ulrich | 206/59 |
| 2,714,066 | 7/1955 | Jewett et al. | 95/8 |
| 2,861,058 | 11/1958 | Unruh et al. | 260/78.5 |
| 3,671,236 | 6/1972 | Beusekom | 96/15 |
| 4,221,862 | 9/1980 | Naito et al. | 430/536 |
| 4,268,601 | 5/1981 | Namiki et al. | 430/159 |
| 4,304,923 | 12/1981 | Rousseau | 560/26 |
| 4,588,669 | 5/1986 | Asano | 430/156 |
| 4,596,757 | 6/1986 | Barton et al. | 430/257 |
| 4,719,169 | 1/1988 | Platzer et al. | 430/258 |
| 4,741,985 | 5/1988 | Aoai et al. | 430/175 |
| 4,774,161 | 9/1988 | Sekiya et al. | 430/175 |
| 4,777,112 | 10/1988 | LaPointe et al. | 430/213 |
| 4,885,225 | 12/1989 | Heller et al. | 430/160 |
| 4,902,594 | 2/1990 | Platzer | 430/14 |
| 4,937,168 | 6/1990 | Platzer | 430/143 |
| 4,948,693 | 8/1990 | Shadrach et al. | 430/143 |
| 4,952,482 | 8/1990 | Barton et al. | 430/325 |
| 4,957,845 | 9/1990 | Isono et al. | 430/166 |
| 4,963,462 | 10/1990 | Wilczak | 430/143 |
| 4,999,266 | 3/1991 | Platzer et al. | 430/14 |
| 5,008,174 | 4/1991 | Platzer | 430/143 |
| 5,017,462 | 5/1991 | Stahlhofen | 430/325 |
| 5,053,311 | 10/1991 | Makino et al. | 430/166 |
| 5,053,381 | 10/1991 | Chapman et al. | 503/227 |
| 5,070,001 | 12/1991 | Stahlhofen | 430/281 |
| 5,071,731 | 12/1991 | Chen et al. | 430/271 |
| 5,087,549 | 2/1992 | Peiffer | 430/253 |
| 5,093,221 | 3/1992 | Chen et al. | 430/257 |
| 5,100,757 | 3/1992 | Platzer et al. | 430/143 |
| 5,238,736 | 8/1993 | Tseng et al. | 428/327 |
| 5,248,583 | 9/1993 | Lundquist et al. | 430/263 |
| 5,258,261 | 11/1993 | Heller | 430/273 |
| 5,270,378 | 12/1993 | Johnson et al. | 524/520 |
| 5,298,361 | 3/1994 | Bonham | 430/260 |

FOREIGN PATENT DOCUMENTS

| | | | |
|---|---|---|---|
| 0326249A2 | 8/1989 | European Pat. Off. | G03C 1/68 |
| 0509514A1 | 10/1992 | European Pat. Off. | G03F 7/11 |
| 0519591A1 | 12/1992 | European Pat. Off. | |
| 3016519A1 | 4/1981 | Germany | G03C 1/78 |
| 3834960A1 | 5/1989 | Germany | G03F 7/10 |

OTHER PUBLICATIONS

S. Shen et al., "Dispersion Polymerization of Methyl Methacrylate: Mechanism of Particle Formation", *J. of Polymer Science: Part A: Polymer Chemistry*, 32, 1087–1100 (1994).

*Polymer Handbook*, Third Edition, Ed. J. Brandrup and E. H. Immergut, John Wiley & Sons, Inc., VI/435–441 (1989).

AIRVOL® Polyvinyl Alcohol, catalog, Air Products and Chemicals, Inc., Allentown, PA.

*Metals Handbook® Ninth Edition*, vol. 5, Surface Cleaning, Finishing, and Coating, 585–600.

AIRVOL® Polyvinyl Alcohol Typical Properites, Air Products and Chemical, Inc. (1992).

Recommended Inks for Melinex® Pretreated Films, Imperial Chemical Industries PLC, 1989.

Melinex® Polyester Films Product Information sheet, ICI Films.

Melinex® Polyester Film Product Information sheets, ICI Americas, Inc., 1985.

Melinex® Polyester Film Technical Data Melinex for Graphics, 1985.

Melinex® Technical Data sheet, ICI Americas Inc., Films Division.

Melinex® Polyester Film, Technical Data sheet, ICI Americas Inc., 1985.

Melinex® Product Information Technical Data sheet, ICI Americas Inc., Films Division, 1990.

*Primary Examiner*—John S. Y. Chu
*Attorney, Agent, or Firm*—Gary L. Griswold; Walter N. Kirn; James J. Trussell

[57] ABSTRACT

A photoimageable element comprising: a substrate; a layer of a photosensitive composition comprising a photosensitive material coated on the substrate; and a protective overcoating comprising an oxygen barrier component and a moisture resistant component; wherein the oxygen barrier component has an oxygen permeability of no greater than about $10^{-14}$ cc(cm)/cm$^2$(sec)(Pa).

21 Claims, No Drawings

PHOTOIMAGEABLE ELEMENTS

FIELD OF THE INVENTION

The present invention relates to photoimageable elements, particularly to protective coatings for photosensitive imaging layers on the photoimageable elements.

BACKGROUND OF THE INVENTION

Photoimageable elements, such as lithographic printing plates, circuit boards, photolabels, photoresists, overlay color proofing films, and the like, typically consist of a substrate on which is coated a layer of a photosensitive material. Depending on the application, this photosensitive material can be coated on metal or plastic, for example. This photosensitive material, which can be a photopolymer, oligomer, monomer, or mixture thereof, typically either undergoes a reaction or promotes a reaction upon exposure to radiation thereby forming an image. In negative-acting systems, the nonexposed portions of the layer of photosensitive material are removed to produce an image. In positive-acting systems, the exposed portions of the layer of photosensitive material are removed to produce an image.

Negative-acting photosensitive imaging systems, e.g., photopolymerizable or radiation-polymerizable systems, typically include a layer of a composition containing a photosensitive material such as an unsaturated monomer or oligomer, a photoinitiator that is activated by radiation, binder resins, and optional colorants and other additives. In the production of free-radical initiated photopolymerizable coatings, the photoimaging reactions are subject to quenching by triplet oxygen thereby adversely affecting the imaging process. To prevent such triplet oxygen quenching of radiation formed free-radicals, the photosensitive layer can be overcoated with a polymer that has a low oxygen permeability. Such polymers are typically transparent, film-forming polymers that do not disrupt the photosensitive layer. In the past, suitable overcoat polymers were those that were soluble only in organic solvents. This created significant environmental concerns with respect to air quality and disposal, for example. More recently, water soluble overcoat polymers have been used to avoid many of the environmental concerns. One particularly suitable water soluble polymer is polyvinyl alcohol.

Polyvinyl alcohol is currently one of the most commonly used overcoat polymers in negative-acting, free-radical initiated, photosensitive imaging systems because of its low oxygen permeability. However, most polyvinyl alcohols are water soluble and therefore moisture sensitive. They also typically produce very smooth surfaces. Thus, they can be subject to blocking, particularly when they come into contact with a second smooth surface under conditions of high humidity. Furthermore, polyvinyl alcohol overcoat layers are often soft and easily embossed or scratched during the photoimaging process, as well as during storage, handling, and transport. One method by which at least some of these problems have been overcome is through the use of organic polymeric beads such as polymethyl-methacrylate beads. See U.S. Pat. No. 5,258,261 (Heller). However, the beads do not overcome the additional problem of blushing under conditions of high humidity, which results from moisture passing through the polyvinyl alcohol overcoat layer to the underlying photosensitive layer causing it to turn hazy, i.e., blush.

SUMMARY OF THE INVENTION

The invention provides a photoimageable element comprising a substrate, a layer of a photosensitive composition comprising a photosensitive material coated on the substrate, and a protective overcoating, which can include one or more layers of material, comprising an oxygen barrier component and a moisture resistant component; wherein the oxygen barrier component has an oxygen permeability of no greater than about $10^{-14}$ cc(cm)/cm$^2$(sec)(Pa). The oxygen barrier component preferably comprises polyvinyl alcohol. The moisture resistant component preferably comprises a polymeric material having a glass transition (Tg) temperature of greater than about 35° C., preferably greater than about 50° C., and more preferably greater than about 70° C. The moisture resistant component generally also improves the hardness of the protective overcoating, particularly under humid conditions. In particularly preferred embodiments, the protective overcoating includes an antiblocking particulate material. The photoimageable element can further include a pressure sensitive adhesive layer and a release liner covering the pressure sensitive adhesive on the side, i.e., a second side, of the substrate opposite that of the photosensitive layer, which is coated on a first side of the substrate.

Preferred embodiments of the present invention include photoimageable elements wherein the protective overcoat comprises one layer comprising a combination of the oxygen barrier component and the moisture resistant component, and optionally, the antiblocking particulate material. Other embodiments include photoimageable elements wherein the protective overcoating comprises a first layer comprising the oxygen barrier component and a second layer comprising the moisture resistant component; wherein the second layer is coated over the first layer. In this latter embodiment, the antiblocking particulate material can be in either layer, preferably it is in the topmost layer. Preferred photoimageable elements are proofing films and photolabels, e.g., metal or plastic labels.

DETAILED DESCRIPTION OF THE INVENTION

The present invention is directed to photoimageable elements that include a substrate on which is coated a photosensitive composition for imaging and a protective overcoating. The protective overcoating is coated over the photosensitive composition and can be one or more layers of material. The protective overcoating, i.e., overcoat, protects the photosensitive composition from the detrimental effects of oxygen and water.

In the practice of the invention, the substrate can be made from materials such as plastics, e.g. polyester, polyolefin, nylon, and the like; ceramics, e.g., glass, porcelain, and the like; or metals, e.g., aluminum, stainless steel, and the like. Preferably, the substrate is a sheet material made from a dimensionally and chemically stable base material. Suitable such sheet materials include polyester films, such as poly(ethylene terephthalate) and poly(butylene terephthalate), preferably having a thickness of about 1–15 mils (0.025–0.38 mm), and more preferably about 1.5–5 mils (0.038–0.13 mm), and metal foils and sheeting such as aluminum sheeting, preferably having a thickness of about 2–20 mils (0.05–0.5 mm), and more preferably about 4–15 mils (0.1–0.38 mm). For proofing films and certain label applications, for example, it is particularly desirable if the substrate is a transparent, generally colorless, sheet material.

The substrate can be optionally treated to enhance adhesion of the photosensitive material to the substrate, if desired. Useful priming processes for polymeric materials, such as polyester films, include flame treatment, corona treatment, and chemical priming with, for example, melamine-acrylate or methacryate resins or low molecular weight polyester resins such as those available under the tradename VITEL 2700 from Goodyear Tire and Rubber Co., Apple Grove, W. Va. Many polymeric substrates can be purchased pretreated, i.e., wherein one or more of these surface treatment processes has been performed by the vendor. For example, MELINEX 505 polyester film, which is available from ICI Americas Inc., Wilmington, Del., is pretreated on both sides to promote adhesion to many industrial coatings and inks. Preferably, the polymeric substrate is chemically primed.

Metal substrates are usually treated for protection of the metal surface and/or for enhancing the adhesion of coatings to the metal. Multiple treatments can be used to provide variations in surface color, adhesion to specific coatings, etc. Typical processes include, for example, degreasing, desmutting, anodizing, dyeing, sealing of the surface, and silicate coating. As with polymeric substrates, many metal substrates can be purchased preheated. Preferably, the metal substrate is cleaned and then treated with a silicate coating.

Silicate coatings have been found to be particularly useful for metal substrates such as aluminum sheeting. Examples of such treatments are described in U.S. Pat. No. 2,714,066 (Jewett et at.). Treating the metal substrate with a silicate typically renders the metal surface hydrophilic and provides a scum-preventing film or surface. The silicate coating also enhances adhesion between the metal substrate and the photosensitive material (or any intermediate layers of material) and provides a barrier such that the metal substrate and the overlying material(s) do not react. Thus, the silicate can enhance the shelf life of a nonexposed construction. Suitable silicates are water soluble or water dispersable, and are preferably in the form of a colloidal solution. Examples of suitable silicates include calcium silicate, silicic acid, sodium silicate, and the like, which are commercially available from conventional sources. Preferred silicates are alkali metal silicates such as sodium silicate (1 $Na_2O$:2 $SiO_2$) which is commercially available as E brand sodium silicate from PQ Corp., Valley Forge, Pa.

The substrate can also have coated thereon a primer layer that enhances the adhesion of the photosensitive material and/or the other components in the photosensitive layer to a metal or polymeric surface. Preferred primer materials are those that also enhance image quality. Suitable such materials include, for example, diazo compounds, acrylic resins crosslinked with melamine resins, and polyester resins. Preferably, the primer materials are photoactive, and more preferably are reactive with the components of the photosensitive layer upon exposure to radiation. Most preferably, the primer materials are diazo compounds. A particularly preferred diazo compound is the condensation product of p-diazodiphenylamine and p-formaldehyde, prepared as described in U.S. Pat. No. 2,714,066 (Jewett et al.). The diazo compound, which is generally in the form of a resin, is typically dispersed in a water/methanol mixture and coated onto the substrate. A variety of conventional coating techniques, e.g., roll coating, can be used. The primer layer can also include colorants and stabilizers. Examples of suitable stabilizers are citric acid, boric acid, thiourea, and blends thereof.

The photosensitive layer, i.e., layer of photosensitive composition, can be either a positive—or a negative-acting imaging system. In the practice of the invention, the protective overcoating is particularly useful for negative-acting imaging systems in which radicals are generated in a photopolymerization process. The photosensitive composition for a negative-acting photosensitive imaging system comprises at least one kind of photopolymerizable material and at least one kind of photoinitiator. Preferably, the photosensitive composition also includes colorants and binders. Other optional components can be included, such as surfactants, wetting agents, coating rheology modifiers, optical brighteners, plasticizers, fillers, and the like. The photosensitive layer is typically formed by dispersing the materials in a suitable solvent and coating the dispersion onto a substrate, preferably an appropriately treated substrate. The coated substrate is then dried to remove a substantial amount of the solvent, although residual solvent can be present in the coating. Suitable solvents include ketones, alkyl ethers or acetates of propylene glycol, dioxalane, butyrolactone, alcohols, and mixtures thereof.

The photosensitive layer can be formulated such that it can be developed in an aqueous solution that is acidic, neutral, or alkaline. Preferably, the photosensitive layer can be developed in an alkaline developing solution because of the availability of materials to produce such systems. A photosensitive layer that can be developed in an alkaline solution typically contains a photopolymerizable material that can be acidic or nonacidic. If it is nonacidic, the photosensitive layer preferably includes an acidic material, such as an acidic binder. The strength of the developer required to develop the image is generally directly proportional to the molecular weight and the acid content of the acidic material. Generally, photopolymerizable materials with lower molecular weights and high acid content are easier to develop and therefore do not need very aggressive developers. However, too much acid content or too high a molecular weight can cause destabilization of pigment dispersions (discussed below) when acidic binders are used to disperse the pigments.

Useful photopolymerizable materials are polymerizable compounds having at least one ethylenically unsaturated moiety. The compounds can include polymers, monomers, oligomers, prepolymers, or mixtures thereof. Preferably, the photopolymerizable material comprises a multifunctional acrylate oligomer that forms a high molecular weight polymer when exposed to radiation (e.g., ultraviolet radiation or visible light) in the presence of a photoinitiator. Some examples of oligomers nonexclusively include multi(m-eth)acrylated urethane and/or epoxy oligomers. Preferably, the photopolymerizable material is a multi(meth)acrylated urethane oligomer as described in U.S. Pat. No. 4,304,923 (Rousseau).

The photosensitive composition preferably includes additional polymeric materials to reduce the tackiness of the photopolymerizable material and increase the hardness of the photopolymerizable layer while still maintaining developability in an alkaline solution. Suitable such materials include acidic acrylic and methacrylic polymers and copolymers, polyvinyl acetals, polyvinyl acetate/crotonic acid copolymers, styrene maleic anhydride half ester resins, polyvinyl acetals modified with anhydrides or amines, and mixtures thereof. In a preferred embodiment, the photosensitive layer includes, in addition to the photopolymerizable material, a carboxylated styrene acrylic resin and an acidified polyvinyl acetal resin.

Polyvinyl acetal resins can be modified by methods known in the art, such as methods disclosed in U.S. Pat. Nos. 4,774,161, 4,777,112, 4,741,985, 4,588,669, and 2,861,058, and EP 519,591. Typically, the polyvinyl acetal polymer containing free hydroxyl groups is dissolved in an aprotic solvent. The dissolved resin is then reacted with a dicarboxylic acid anhydride, preferably in the presence of a catalyst such as a tertiary amine, specifically, triethylamine. The resulting solution of the acid modified polyvinyl acetal resin can then be diluted for use in the photosensitive color solution with solvents such as a blend of methyl ethyl ketone and propylene glycol monomethylether.

A particularly preferred photopolymerizable system is disclosed in U.S. Pat. No. 5,258,261 (Heller). One or more kinds of photopolymerizable materials are present in the composition in a total amount of about 10–90% by weight, preferably about 40–70% by weight, based on the total dry weight of the photosensitive layer (i.e., solids content of the coating composition).

The photoinitiator(s) are used in the photosensitive layer to initiate the polymerization reaction. In particularly preferred embodiments, the photoinitiator(s) used must not generate a visible color change in the image after exposure. Examples of suitable photoinitiators nonexclusively include triazines, acetophenones, benzophenones, and thioxanthones. The preferred photoinitiators include IRGACURE 907 (2-methyl-1-(4-(methylthio)phenyl)-2-(4-morpholinyl)-1-propane) from CIBA-GEIGY, Greenboro, N.C., IRGACURE 369 from CIBA-GEIGY, QUANTACURE ITX (isopropylthioxanthone) from Biddle-Sawyer, Corp., New York, N.Y., and triazines tethered to alkylarylpolyether alcohols, which are disclosed in U.S. Pat. No. 5,298,361 (Bonham et al.). One or more kinds of photoinitiators are present in the composition in a total amount of typically about 1.0–20% by weight, based on the total dry weight of the photosensitive layer (i.e., solids content of the coating composition). The optimum amount of photoinitiator is dependent upon the type of photopolymerizable material used, molecular weight of the photoinitiator used, and the light filtering effect of the pigment used.

Pigments or dyes can be used as colorants in the photosensitive layer if desired. Of the various types of colorants, pigments are preferred generally because they provide more light stable colored images. The pigments, which can be organic or inorganic, are generally introduced into the photosensitive formulation in the form of a millbase. A millbase typically includes a pigment, a binder resin that can be milled with the pigment and provides a media to keep the pigment in dispersion, dispersing aids such as surfactants, and a solvent or mixture of solvents, such as methyl ethyl ketone, propylene glycol monomethylether, for suspending the dispersion. Many different pigments are commercially available from sources such as Sun Chemical Co., Mobay Chemical Co., etc., and are well known in the art. The pigment type and color are chosen such that the coated colored element is matched to a preset color target or specification set by the industry.

Binder resins are used to keep the pigment in dispersion while they are milled, and to balance developability and tack when used in a photosensitive coating. Suitable binders nonexclusively include polyvinyl acetate/crotonic acid copolymers, styrene maleic anhydride half esters resins, acrylic and methacrylic polymers and copolymers, polyvinyl acetals, polyvinyl acetals modified with anhydrides and amines, and styrene acrylic resins. These can be used in various combinations if desired to impart different characteristics. In a preferred embodiment, the binder resin is a mixture of a polyvinyl acetal resin, which is a superior resin for milling the pigments, and a carboxylated styrene acrylic resin, which imparts acidity to the millbase to enhance the developability of the photosensitive layer.

Typically, the amount of binder resin used is kept to a minimum needed to keep the pigments dispersed. This amount can vary depending on such factors as the type of pigment, surface treatment of the pigment, milling process (which can involve ball milling, high shear grinding mixers, two-roll pigment mills, and the like), and the size of the pigment particles, for example. Useful amounts are about 10–90 wt-% pigment and 10–90 wt-% binder resin, based on the total solids weight of the pigment and binder. Preferably the binder resins are used in an amount of about 15–60 wt-%.

Other components can also be included in the millbase to improve solution stability, processing, and compatibility of the millbase to the formulation to which it is added. Examples of other optional additives include dispersing agents other than the binder resins, surfactants, fluorescent materials, optical brighteners, UV absorbers, fillers, etc.

The amount of pigment present in the photosensitive layer will depend on the desired color. Typically, the amount of millbase added to the photosensitive layer composition, i.e., photosensitive color solution, is up to about 35 wt-% (solids in the millbase resulting from pigment, binder, etc., based on the total solids weight of the photopolymerizable composition).

The protective overcoating useful in the practice of the invention is soluble in the desired developer to allow for development of an image of the photosensitive layer. It includes an oxygen barrier component and a moisture resistant component. The protective overcoating can be a single layer or it can be multiple layers of the same or different materials. That is, it can be a single layer of a mixture of the oxygen barrier component and the moisture resistant component or it can be separate layers of the oxygen barrier component and the moisture resistant component, with the proviso that the moisture resistant component overcoats the oxygen barrier component. It should be understood that the protective overcoating can also include multiple layers of the same material, e.g., multiple layers of the combination of oxygen barrier component and moisture barrier component. Thus, the protective overcoating can be referred to as a stratum having one or more layers of material. In a preferred embodiment, the protective overcoating, i.e., stratum, is a single layer of material that provides oxygen barrier properties as well as moisture resistant properties.

The oxygen barrier component is needed for photosensitive materials which, when exposed to radiation, generate free radicals that can be quenched by oxygen, thereby inhibiting the polymerization process. The oxygen barrier should be clear, i.e., nonhazy, after it has been formed on the photosensitive layer, and remain clear until the photoimageable element, e.g., label or color proof, is used. The oxygen barrier component should have an oxygen permeability of no greater than about $10^{-14}$ cc(cm)/cm$^2$(sec)(Pa). A preferred material for an oxygen barrier component is polyvinyl alcohol, which has a reported oxygen barrier permeability of $10^{-16}$–$10^{-18}$ cc(cm)/cm$^2$(sec)(Pa) (i.e., per unit pressure drop) (*Polymer Handbook*, Third Edition, Ed. J. Brandrup and E. H. Immergut, John Wiley & Sons, Inc., 1989, pages VI/435–441).

Commercially available polyvinyl alcohols, such as those available from Air Products & Chemicals, Inc., Allentown, Pa., under the tradename AIRVOL, are classified by viscosity and percent hydrolyzed. Viscosities (as measured in a 4% solids solution in water at 20° C. on a Brookfield viscometer) can be ultra low (3–4 centipoise or "cps"), which have number average molecular weights of about 7,000–13,000 and weight average molecular weights of about 13,000–23,000; low (5–6 cps), which have number average molecular weights of about 15,000–27,000 and weight average molecular weights of about 31,000–50,000; medium (22–30 cps), which have number average molecular weights of about 44,000–65,000 and weight average molecular weights of about 85,000–146,000; and high (40–65 cps), which have number average molecular weights of about 70,000–101,000 and weight average molecular weights of about 124,000–186,000. Polyvinyl alcohols having low viscosities are preferred for ease of coating, while having a sufficiently high molecular weight to provide adequate moisture resistance.

Polyvinyl alcohols are commercially available with varying degrees of hydrolysis, i.e., from about 80% to 99.3+%. Preferred polyvinyl alcohols have a degree of hydrolysis of about 85–99%. In general, the higher the degree of hydrolysis, the better the oxygen barrier properties. Also, polyvinyl alcohols with a higher degree of hydrolysis have better moisture resistance and are less water sensitive. Higher molecular weight polyvinyl alcohols also have better moisture resistance, but increased viscosity. In the practice of the invention, it is desirable to find a balance of properties in which the polyvinyl alcohol has sufficient moisture resistance, good oxygen barrier properties, can be handled easily in the coating process (knife coating, roll coating, die coating, curtain coating, etc.), and is sufficiently water soluble so as to be easily removed during the developing process. To achieve such a balance, it is useful to blend a polyvinyl alcohol with a higher degree of hydrolysis and higher viscosity, with one having a lower degree of hydrolysis and lower viscosity. For example, one could blend a polyvinyl alcohol having a degree of hydrolysis of about 87–89% hydrolysis and a viscosity of about 5.2–6.2 (AIRVOL 205 from Air Products) and a polyvinyl alcohol having a degree of hydrolysis of about 98.0–98.8% and a viscosity of about 5.5–6.6 (AIRVOL 107 from Air Products). It should be understood, however, that the choice of polyvinyl alcohol can also be controlled by the coating method used. For example, when die coating, it is desirable to maintain the coating viscosity of the protective layer composition between about 5 and 15 cps, and preferably between about 6 and 12 cps.

Useful amounts of the oxygen barrier component in the protective overcoating range from about 10 wt-% to about 100 wt-%, based on the total weight of solids in each individual layer of the protective overcoating. For example, 100% polyvinyl alcohol can be used in a first layer of the overcoating when it is overcoated with a layer containing the moisture resistant component. In preferred embodiments, however, the oxygen barrier component and the moisture resistant component are combined in one layer. In such embodiments, the oxygen barrier component is preferably used in an amount of about 10–95 wt-%, more preferably about 25–90 wt-%, and most preferably about 40–80 wt-%, based on the total weight of solids in the protective overcoating.

The moisture resistant component provides protection from: (1) blushing or clouding of the underlying photosensitive layer; (2) surface flaws or imperfections that result from a number of causes such as scuffing of the surface as a result of running over idler rolls during processing; (3) surface impressions that result from winding a roll of sheet material under tension; and (4) blocking or picking, in which portions of the coating stick to the backside of the sheet material in roll form or are "picked off" of the coated side and adhere to the backside of the sheet, leaving voids in the coating. Thus, the moisture resistant component also provides hardening characteristics to the protective overcoating.

The moisture resistant component is preferably water soluble or water dispersable prior to being dried and substantially insoluble in water or aqueous acidic solutions after drying, while still being soluble in an aqueous alkaline solution, i.e., a solution having a pH greater than 7.0. Suitable materials for the moisture resistant component include polymeric materials having a glass transition temperature of greater than about 35° C., preferably greater than about 50° C., and more preferably greater than about 70° C. Examples of useful materials include acrylic polymers, acrylic copolymers such as styrene acrylic resins, urethane resins, polyester resins, and the like. Preferably, these are modified with acidic functional groups. A preferred material is an alkaline soluble resin having an acid number of about 150–250. A particularly preferred material is a carboxylic acid functional styrene acrylic resin, such as those commercially available under the JONCRYL trademark (e.g., JONCRYL 67, JONCRYL 63; and JONCRYL 690) from S. C. Johnson Wax of Racine, Wis. To obtain the aqueous alkaline solubility, the JONCRYL materials can be combined with a volatile base material, such as ammonium hydroxide.

In a preferred embodiment, the protective overcoating is a single layer formed from a composition comprising at least one kind of polyvinyl alcohol and at least one kind of acrylic copolymer, preferably a styrene acrylic resin, and more preferably, a carboxylated styrene acrylic resin. The polyvinyl alcohol and acrylic copolymer should be compatible with each other. By compatible, it is meant that when a film of a solution of the components is coated and dried, the film is essentially transparent, with no haziness or cloudiness.

Useful amounts of the moisture resistant component in the protective overcoat range from about 5 wt-% to about 100 wt-%, based on the total weight of solids in each individual layer in the protective overcoating. For example, 100% JONCRYL styrene acrylic resin can be used in a second layer of the overcoating when it overcoats a layer containing the oxygen barrier component. In preferred embodiments, however, the oxygen barrier component and the moisture resistant component are combined in one layer. In such embodiments, the moisture resistant component is preferably used in an amount of about 5–75 wt-%, and more preferably about 20–60 wt-%, based on the total weight of solids in the protective overcoating.

The protective overcoating can further include additives to prevent blocking. These additives can be in any layer of the overcoating; preferably, however, they are in the topmost layer. Useful additives include water insoluble organic or inorganic particulate material, i.e., particles or beads, that do not fuse during drying of the protective overcoating and are compatible with the components of the coating composition. As used in this context, "compatible" means that the particles do not agglomerate in the dried film.

A preferred antiblocking additive consists of organic polymeric beads that have a narrow size distribution, preferably with the mean of that distribution between 1.5 and 15 times the thickness of the protective layer. Typically, the protective layer can range from about 0.5 μm to about 5 μm thick. Thus, the particles vary from mean sizes of about 0.75 μm to about 75 μm, depending on the specific applied coating thickness. Preferably, the particles vary from mean sizes of about $4 \times 10^{-4}$ cm to about $8 \times 10^{-4}$ cm. The concentration of the particulate material can vary from about 0.1 wt-% to about 1.0 wt-%, preferably about 0.1–0.6 wt-% (based on the total weight of the solids in the protective overcoating) depending on the coating thickness of the protective overcoating, the particle diameter, and the size distribution (the wider the size distribution, the more polymer beads required for a specific antiblocking requirement).

The particulate material preferred in the practice of the present invention should possess the following characteristics: (1) as a preference only (not a requirement), the particles may have a Tg of at least about 45° C., and more preferably at least about 60° C.; (2) a preferably narrow particle size distribution (e.g., fewer than 35%, preferably fewer than 25%, and more preferably fewer than 20%, of the particles by number varying by more than 50% from the mean average diameter) and more preferably a monodisperse particle addition is used; (3) an index of refraction close (i.e., within 0.10) to that of the components of the protective stratum (again, this is a preference and not a requirement); (4) beads without sharp features (e.g., smooth surfaces) are preferred, with spherical, oblong, ovoid, or of elliptical cross-section being most preferred; (5) the particles should be relatively free of surface impurities that resist wetting by a solvent (usually surface impurities should constitute less than 10% of the surface area and preferably less than 3% of the surface area of the particles); (6) the specific gravity of the particles is preferred to be within 25% of that of the coating solution to assist in preventing separation during coating; and (7) the particles should be nontacky to enable them to both be easily dispersed and resist agglomeration in the coating solutions.

Examples of suitable antiblocking particulate material, i.e., particles or beads, nonexclusively include: polymethylmethacrylate (PMMA beads); polyethylene beads; substituted PMMA beads (e.g., substituted with carboxyl groups) such as those available under the tradenames RHOPLEX B-88 latex, ACRYLOID ASE-95NP (alkali soluble or swellable beads), and ACRYSOL ASE-60 all from Rohm & Haas, Charlotte, N.C.; carboxylated polystyrene beads; azlactone beads; urea-formaldehyde particles, such as PERGOPAK M2 particles available from CIBA-GEIGY; styrene/acrylic beads, such as the hollow sphere "pigment" beads available under the tradename RHOPAQUE HP-91 from Rohm & Haas; and beads comprising diol di(meth)acrylate homopolymers or copolymers of these diol di(meth)acrylates with long chain fatty alcohol esters of (meth)acrylic acid and/or ethylenically unsaturated comonomers, such as SMA-HDDA (stearyl methacrylate/hexanediol diacrylate) crosslinked beads, as described in U.S. Pat. No. 5,238,736 (Tseng et al.). Also useful antiblocking particulate material includes inorganic particles including silica particles such as SIPERNAT particles available from DeGussa Corp., Arlington Heights, Ill., SYLOID particles available from Grace GmbH, Ridgefield Park, N.J., GASIL 23F particles available from Crosfield Chemicals, Baltimore, Md., and the like.

The preparation of polymethylmethacrylate beads is generally known, and can be made by a number of methods, including dispersion polymerization, which is described in S. Shen, et al., *J. Polymer Sci., Part A: Polymer Chem.*, 32, 1087–1100 (1994), John Wilery & Sons, Inc. The bead solution typically includes a dispersing agent to keep the beads in suspension and prevent them from agglomerating in the solution. Polymeric dispersing agents are useful in the practice of the present invention, and include poly(vinylpyrrolidone) available from GAF Corp., and anionic polymeric dispersing agents sold under the tradename DAXAD by W. R. Grace, New York, N.Y.

Briefly, the process for making PMMA beads involves washing methylmethacrylate monomer with 10% aqueous sodium hydroxide and passing through an activated aluminum oxide column to remove any inhibitor. A typical formulation for polymerization, in weight percent, is 2.0–10.0% methylmethacrylate, 93.0–85.9% methanol, 4% dispersing agent, and 0.1% polymerization initiator. Useful initiators include free radical initiators such as 2,2'-azobis(isobutyronitrile) available from DuPont under the trade name VAZO 64. Specifically, in the process, the dispersing agent, initiator, methanol, and methylmethacrylate monomer are added to a bottle, cooled in ice, and mixed. The solution is passed through a 0.2 micrometer pore size filter to remove any colloidal species, and placed into a reaction container that had been cooled with ice. The reaction container is purged with nitrogen, sealed, and heated to about 55° C. until the reaction is finished. For a 5 milliliter sample, the reaction time is about 20 minutes. The particles are then filtered, washed with water, and dried at ambient temperature to produce a free flowing powder that can be redispersed in water with a dispersing agent.

Other optional components in the protective overcoating include adjuvants to enhance coating or shelf stability such as defoamers, surfactants and biocides. Surfactants improve the wetting of the protective coating onto the photosensitive layer to form a smooth coating. Suitable examples of surfactants include those commercially available from Rohm & Haas under the TRITON tradename, and from Air Products under the SURFYNOL tradename, or organic solvents such as isopropanol. Biocides may be added to the composition to improve shelf life of the compositions, and are commercially available, such as those sold under the tradename KATHON by Rohm & Haas.

The total thickness of the protective overcoating can range from about 0.5 μm to about 5 μm, whether in one layer or multiple layers, depending on the substrate on which it is coated. Thinner coatings are usually used on film substrates, e.g., polyester films. The protective overcoating is preferably dried at a temperature high enough to drive off most of the water. For a 0.5 μm coating, three minutes at about 80° C. is generally sufficient. For thicker coatings, longer dwell times in the oven may be needed.

A layer of an adhesive can aim be used in certain preferred embodiments of the present invention. It is applied to the substrate on the side opposite to that of the photosensitive layer and can be protected by a release liner. The adhesive can be a pressure sensitive adhesive or a heat activated adhesive. Pressure sensitive adhesives are known in the art and can be coated from water, as in emulsion adhesives, or they can be hot melt coated, or solvent coated. Adhesives are typically selected to adhere to the desired surfaces. For example, acrylate pressure sensitive adhesives are particularly useful for adhering to aluminum and polyester substrates because of the ability to adhere to polar substrates, and are relatively inexpensive. The preparation of acrylate adhesives can be made by a number of different processes such as the process disclosed in U.S. Pat. No. Re 24,906 (Ulrich). Other useful types of adhesives include natural rubber adhesives, block copolymer adhesives, and silicone adhesives. Pressure sensitive adhesives are commercially available as emulsion or solvent based adhesives which can be coated directly onto the substrate, dried and/or cured, and laminated to a release liner (e.g., paper or a polypropylene, polyethylene, or polyester film coated with a release material such as silicone) to protect the adhesive. The adhesive can also be coated onto a release liner, dried and/or cured, and then laminated onto the substrate. The adhesive can also be supplied as an adhesive transfer tape such as SCOTCH brand laminating adhesive 9475 or 9466, which are available from Minnesota Mining & Manufacturing Company, St. Paul, Minn.

The photoimageable elements of the present invention can be used as printing plates, proofing films, photolabels, e.g., metal and plastic labels, signs, plaques, and a variety of other applications.

Objects and advantages of this invention are further illustrated by the following examples. The particular materials and amounts thereof recited in these examples as well as other conditions and details, should not be construed to unduly limit this invention. All materials am commercially available except where stated or otherwise made apparent.

EXAMPLES

TEST PROCEDURES

Surface Quality

This test measures the ability of the protective overcoating to resist scuffing, surface impressions, etc., when aged at room temperature (20°–25° C.) under a weight. A substrate sheet material having coated thereon an optional primer layer, the photosensitive layer, and the protective overcoating was cut into 10 samples measuring 12 inches×18 inches (20 cm×46 cm) and wrapped in a black, 3-mil ($7.6 \times 10^{-3}$ cm), photographic grade, polyethylene bag (available from either Banner Packaging, Inc., Oshkosh, Wis., or American Western Corp., Fairmont, Minn.). A 5 pound weight (2.7 kg) was placed on top of this package, and the samples were aged for 7 days at room temperature (20°–25° C.). Each sample was then inspected for visual appearance, rated on a scale of 0 to 6, and the physical condition of each sample was recorded. Sheet 1 refers to the top sample in the stack, and sheet 10 refers to the bottom sample in the stack. The rating scale is as follows:
0=unblemished surface with no visible imperfections
1–2=slight flaws, but would not affect image quality
3=numerous flaws, but would not affect image quality
4=numerous flaws that could affect image quality
5–6=numerous flaws that would affect image quality In the aging test, the fewer the number of sheets exhibiting flaws, the better the protective overcoating. It is preferable to have as many sheets as possible, out of the ten sheets in the stack, with a rating of 0.

Exposure Latitude

The exposure latitude is a subjective test to measure the range of exposure time within which an exposed image can hold a given size dot and clean out a given percent of a screen on a defined test target. Although test values cannot be compared when the test is performed at different times by different operators, it is believed to be a viable comparison of a set of samples tested at the same time by the same operator.

The test parameters used were either a 2% dot and 98% screen, or 5% dot and a 95% screen, on a 150-lines/inch UGRA test target. In the test, a series of exposures were made for each sample using the test target, with each exposure increasing in the length of exposure time from the previous exposure by a factor of 1.188 seconds. The test was performed using an ultraviolet lamp having a majority of its emission spectra wavelength between 375 and 410 nanometers (obtained from Fusion Systems, Rockville, Md.).

The series of images for each of the samples were then developed on a model 2430 Processor (commercially available from Minnesota Mining & Manufacturing Company, St. Paul, Minn.) using the developing solution described below. The images were then inspected and the number of images that fall within the test parameter were determined. The 2% dot or 5% dot determines the lower limit on the exposure time because a required minimum exposure time is needed to form the dot image. The 98% screen or 95% screen determines the maximum exposure time before the screen image is overexposed and the imaged screen becomes clogged and does not clean out during developing. The number of exposures that fall within the test parameters (2% dot and 98% screen, or 5% dot and 95% screen) are totalled, and the centerpoint exposure in seconds (see) determined. The exposure latitude is the number of exposures that fall within the desired test parameters divided by two. For example, if a sample had three exposures which held a 2% dot and had a 98% screen, and the consecutive exposure times were 10 seconds, 12 seconds, and 14 seconds (generally nonlinear because exposure time is logarithmic), the exposure latitude is 1.5 and the centerpoint exposure is 12 seconds.

Blushig

This test is a measure of the amount of blushing, i.e., haze, that occurs when a sample is aged in a humidity chamber at 90° F. (32° C.) and 90% relative humidity for 24 hours. Blushing occurs when moisture permeates the protective overcoating and causes the color to become hazy or cloudy with a loss in transparency. Samples were graded on a grading scale from 0 to 6 in which a rating of 0 indicates no visible cloudiness, 1 is slightly cloudy, etc., and 6 is completely cloudy.

Optical Density

This test is a measure of a loss of light transmission through a sample as indicated by a lower value of optical density. The change in optical density was measured with a Greytag Model SPM 100 spectrophotometer (available from Greytag Ltd., Regensdorf, Switzerland). A typical value for a poly(ethylene terephthalate) substrate coated with a light blue photosensitive layer and a polyvinyl alcohol oxygen barrier that has not been aged in high humidity is 2.74. The spectrophotometer measures the amount of light reflected and refracted from a sample placed over a black background. A higher number indicates that more light is transmitted through the sample and absorbed by the background, and therefore a more clear sample. A lower number indicates greater light reflection and refraction, and therefore a more cloudy or less clear sample.

Blocking

This test is a measure of the tendency for sheets of coated material to stick together when aged at elevated temperature and humidity. Any number from about 10 to 60 (typically about 25) sheets measuring 4 inches by 8 inches (10.16 cm by 20.32 cm) were stacked together in a face to back configuration and aged at 90° F. (32° C.) and 90% relative humidity for 24 hours. The sheets are removed from the oven, cooled and graded for blocking as follows:
0=no sticking between sheets
1=few small spots of adhesion usually around the edges
2=increased number of spots of adhesion
3=spots of adhesion across the entire sheet
4=larger spots of adhesion across the entire sheet
5=sheets are nearly uniformly adhered together, but can be carefully separated with no color transfer
6=sheets adhered together, and cannot be separated without damaging coating The readings for the sheets are averaged to provide a blocking grading. Lower numbers are desired.

PREPARATION OF MATERIALS

Preparation of Acrylated Urethane Oligomer

A polyol was prepared by mixing ε-caprolactone (54.3 g, 0.48 equivalent), dipentaerythritol (15.3 g, 0.36 equivalent), and zinc borate catalyst (0.02 g) in a 100-mL flask. The mixture was heated to 170° C. for 4 hours under a nitrogen atmosphere. The mixture was cooled under a nitrogen atmosphere to room temperature to yield a polyol having an hydroxy equivalent weight of 200.

To a 1-liter flask was added 2,4-tolylene diisocyanate (86.2 g, 0.99 equivalent), BHT (butylated hydroxy toluene) inhibitor (0.61 g), methyl ethyl ketone (112 g), dibutyltin dilaurate (0.12 g), and methacrylic acid (3.5 g). A 90/10 nitrogen/oxygen mixture was bubbled through the mixture during the reaction. The mixture was stirred and (70.9 g, 0.54 equivalent) hydroxyethyl methacrylate was slowly added. When all of the hydroxyethyl methacrylate was reacted, polyol (175.2 g, 0.91 equivalent), methyl ethyl ketone (110 g), and dibutyltin dilaurate (0.28 g) were added. The flask was held at a reaction temperature of 60° C. for 8 hours or until no isocyanate was present as determined by infrared spectroscopy. Following this, succinic anhydride (27.0 g, 0.27 equivalent), lithium acetate (0.7 g), and methyl ethyl ketone (18 g) were added to the flask. The resultant reaction mixture was held at 70° C. for 16 hours. The final product was a carboxy-substituted urethane oligomer.

Preparation of Triazine Photoinitiator

This preparation illustrates a simple, two-step, one-batch reaction of 2,4-bis(trichloromethyl)-6-[3-(2-hydroxyethoxy)styryl]-1,3,5-triazine (meta-MOSTOL), 2,4-tolylene diisocyanate (TDI), and polyoxyethylene nonylphenol (IGEPAL CO-520) to prepare a mixture containing 80% meta-MOSTOL/TDI/POENP5, 15% [meta-MOSTOL]$_2$/TDI, and 5% [POENP5]$_2$/TDI, which mixture can function as a photoinitiator. POENP5 is a polyoxyethylene nonylphenol having a mole ratio of 5 polyoxyethylene units to nonylphenyl units (commercially available from GAF Corp., New York, N.Y. under the tradename ICEPAL CO-520).

A stirred solution of 2,4-bis(trichloromethyl)-6-methyl-1,3,5-triazine (103 g, 0.31 mole), 3-(2-hydroxyethoxy)benzaldehyde (47 g, 0.28 mole), and ammonium acetate (10.5 g) in 270 mL of methanol was refluxed for 12 hours. After the mixture had cooled, an additional 80 mL of methanol was added, followed by 112 mL of water. The product precipitated from the reaction solution, was filtered, and dried to yield 74 g of meta-MOSTOL, mp 127°–128° C.

To a stirred dispersion containing meta-MOSTOL (55.00 g, 0.1151 mole) and 2,4-tolylene diisocyanate (18.2 g, 0.102 mole) in 200 mL of toluene at a temperature of 16° C. was added dibutyltin dilaurate (0.150 g). A slight exotherm raised the temperature of the reaction mixture to 19° C. and the reaction mixture became clear after approximately 20 minutes. The meta-MOSTOL had completely reacted in 5 hours. The resulting mixture was analyzed by GPC and found to contain the following materials: meta-MOSTOL/TDI (54.5 g, 0.0837 mole), (meta-MOSTOL)$_2$/TDI (17.7 g, 0.0314 mole), and 2,4-tolylene diisocyanate (0.9 g, 0.0052 mole).

To this mixture was added a 79.2% solution of polyoxyethylene nonylphenol (IGEPAL CO-520) (58.92 g, 0.0941 mole) in toluene. The solution was heated to a temperature of 60° C. and maintained at that temperature for four hours. Infrared analysis indicated that all of the isocyanate had reacted. The reaction mixture was determined by high performance liquid chromatography (HPLC) analysis to contain approximately 80% (96.0 g) meta-MOSTOL/TDI/POENP5, 15% (78.8 g) [meta-MOSTOL]$_2$/TDI, and 5% (6.0 g) [POENP5]$_2$/TDI. Removal of the toluene under vacuum by means of a rotary evaporator provided a slightly brown viscous syrup. For ease of handling, this material was redissolved in sufficient methyl ethyl ketone to produce a solution having a concentration of approximately 50%.

Preparation of Diazo Resin

The following reactions were carded out under subdued light, e.g., a yellow light. The sulfate salt of p-diazodiphenyl amine (34 parts) was mixed with p-formaldehyde (3.25 parts) and anhydrous zinc chloride (4.5 parts). This mixture was gradually introduced into cool sulfuric acid (135 parts, 66° Baume), care being taken that the temperature did not exceed 6° C. When poured on twice its weight of ice, the brown solution decomposed to a black tarry material, which was then collected and dissolved in water. Addition of an excess of a saturated zinc chloride solution to this aqueous diazo resin resulted in a yellow precipitate, which was then collected, dissolved in water, and reprecipitated using alcohol. This new precipitate was the purified light-sensitive diazo resin. A priming solution was prepared by mixing 95.44 parts distilled water, 0.28 part citric acid, 0.28 part boric acid, 0.83 part thiourea, 3.10 parts diazo resin, and 0.07 part surfactant (TRITON X-100 available from Rohm & Haas).

Developer Solution

A developer solution was prepared by mixing, by weight percent, 1% sodium carbonate, 1% potassium bicarbonate, 0.1% surfactant (SURFONYL 465 available from Air Products & Chemicals, Inc., Allentown, Pa.), and 97.9% water.

Preparation of Millbase Compositions

Millbase compositions were prepared by dispersing and milling the pigments, the solvents, and the resins with the surfactant and dispersing aid. Specific compositions are shown in Table 1.

TABLE 1

| | Millbase Compositions | | | | | | | | | |
|---|---|---|---|---|---|---|---|---|---|---|
| | Black | | Green Shade Cyan | | Red Shade Cyan | | Blue Shade Magenta | | Red Shade Magenta | |
| Component | % by Wt of Total Soln | % by Wt of Solids | % by Wt of Total Soln | % by Wt of Solids | % by Wt of Total Soln | % by Wt of Solids | % by Wt of Total Soln | % by Wt of Solids | % by Wt of Total Soln | % by Wt of Solids |
| Black pigment (Raven 760 Black pigment from Columbia Chemical Co., New York, NY) | 11.07 | 57.1 | — | — | — | — | — | — | — | — |
| Cyan Pigment 249-0592 (Sun Chemical Co., Chester, SC) | — | — | 8.68 | 57.86 | — | — | — | — | — | — |
| Cyan Pigment | — | — | — | — | 8.7 | 57.97 | — | — | — | — |

TABLE 1-continued

| | Millbase Compositions | | | | | | | | | |
|---|---|---|---|---|---|---|---|---|---|---|
| | Black | | Green Shade Cyan | | Red Shade Cyan | | Blue Shade Magenta | | Red Shade Magenta | |
| Component | % by Wt of Total Soln | % by Wt of Solids | % by Wt of Total Soln | % by Wt of Solids | % by Wt of Total Soln | % by Wt of Solids | % by Wt of Total Soln | % by Wt of Solids | % by Wt of Total Soln | % by Wt of Solids |
| 248-0615 (Sun Chemical Co.) | | | | | | | | | | |
| Rt-333D Blue Pigment (CIBA-GEIGY) | — | — | — | — | — | — | 6.8 | 56.66 | — | — |
| Magenta Pigment 234-0077 (Sun Chemical Co.) | — | — | — | — | — | — | — | — | 8.5 | 56.3 |
| Polyvinyl Butyral (BUTVAR B-98 polyvinyl acetal from Monsanto, St. Louis, MO) | 1.98 | 10.2 | 2.92 | 19.47 | 2.9 | 19.49 | 2.24 | 18.67 | 1.1 | 7.3 |
| Carboxylated styrene acrylic resin (JONCRYL 67 from S. C. Johnson Wax, Racine, WI) | 5.32 | 27.4 | 2.92 | 19.47 | 2.9 | 19.49 | 2.24 | 18.67 | 4.5 | 29.8 |
| Dispersing agent (DISPERSBYK 161 from Byk Chemie, USA, Wallingford, CT) | 0.99 | 5.1 | 0.45 | 3.0 | 0.43 | 2.85 | 0.70 | 5.83 | 0.85 | 5.6 |
| Surfactant (FC-430 from Minnesota Mining & Manufacturing Co., St. Paul, MN) | 0.04 | 0.2 | 0.03 | 0.2 | 0.03 | 0.2 | 0.02 | 0.17 | 0.16 | 1.1 |
| Methyl ethyl ketone | 48 | — | 51 | — | 51.02 | — | 52.8 | — | 50.94 | — |
| Propylene glycol monomethylether | 32 | — | 34 | — | 34.02 | — | 35.2 | — | 33.95 | — |
| Percent Solids | 20 | 100 | 15 | 100 | 15 | 100 | 12 | 100 | 15 | 100 |

Photosensitive Color Solutions

Photosensitive color solutions, i.e., photosensitive compositions, were prepared by mixing the millbase compositions with the binders, photopolymers, solvents, etc., in the amounts shown below in Table 2. Normal precautions, such as processing under yellow lights, were taken throughout the handling of the photosensitive materials to prevent premature exposure.

TABLE 2

| PHOTOSENSITIVE COLOR SOLUTIONS — PARTS BY WEIGHT | BLACK | LIGHT BLUE | DARK BLUE |
|---|---|---|---|
| Black Millbase | 22.4 | 0.08 | — |
| Green Shade Cyan Millbase | — | 2.92 | — |
| Red Shade Cyan Millbase | — | 2.00 | 35.27 |
| Blue Shade Magenta Millbase | — | — | 16.31 |
| Red Shade Magenta Millbase | — | — | 2.53 |
| Echo 310 acrylated epoxy (Echo Resins and Laboratories, Versailles, MO) | — | 2.27 | — |
| Acidified BUTVAR ACB-98 — 15% solids in 35% methyl ethyl ketone and 50% propylene glycol monomethylether (BUTVAR B-98 polyvinyl acetal modified with succinic anhydride and triethyl amine as disclosed in EP 519,591 A1) | 9.7 | 4.62 | 2.15 |
| Acrylated urethane oligomer (prepared as described above) — 40% solids in methyl ethyl ketone | 27.1 | 13.27 | 10.46 |
| Carboxylated styrene acrylic resin premix prepared by dissolving 35 parts styrene acrylic resin (JONCRYL 67 available from S. C. Johnson Wax) in 65 parts methyl ethyl ketone | | | |
| Triazine photoinitiator (prepared as described above) — 50% solids in methyl ethyl ketone | 5.4 | 0.84 | 0.80 |
| Fluorochemical surfactant — terpolymer of N-ethyl perfluoro-octanesulfonamidoethyl-methacrylate/butyl methacrylate/acrylic acid in a ratio of 55/35/10 (disclosed in U.S. Pat. No. 5,270,378 (Johnson, et al.)) | — | 0.03 | 0.04 |
| Methyl ethyl ketone | 21.6 | 46.77 | 22.71 |
| Propylene glycol monomethylether | 12.7 | 22.8 | 9.73 |
| % Solids of Solution | 19.9 | 11 | 12.6 |

Example 1

An aluminum substrate was prepared by dipping a 0.005 inch (0.127 mm) thick aluminum substrate (American Aluminum Association H26 3003 available from Alcoa, Davenport, Iowa) into a 3% solids colloidal solution of sodium silicate (E brand sodium silicate available from PQ Corporation, Valley Forge, Pa.), and drying. Prior to this, the aluminum had been cleaned by dipping it in a hot (190° F.) water solution containing about 5% trisodium phosphate, rinsed with water, and immediately desmutted with nitric acid (about 35% solution). After the sodium silicate had been applied, one side was further roll coated with the diazo resin solution described above. The black photosensitive color solution containing the acrylated urethane oligomer was then roll coated to a coating weight of 275 mg/ft$^2$ (dry coating weight, 3.0 g/m$^2$) onto the diazo resin coating and dried at about 130° F. (54 °C.).

A solution for the protective overcoating was prepared by mixing ammonium hydroxide (0.34 part) in deionized water (95.78 parts), and then adding surfactant (0.04 part, TRITON DF-16 from Rohm & Haas, Philadelphia, Pa.), styrene acrylic resin (1.54 parts, JONCRYL 67 from Johnson Wax), and polyvinyl alcohol (2.3 parts, AIRVOL 205 from Air Products & Chemicals, Inc., Allentown, Pa.). The solution was die coated onto the photosensitive layer of the substrate at a dry coating weight of 1.4 g/m$^2$ and dried at 120° F. (49° C.). The coated substrate was then tested for surface quality according to the Surface Quality Test procedure defined above. The results are shown in Table 3.

Example 2

A substrate was prepared as in Example 1. A composition for the protective overcoating was prepared as in Example 1 except that the amount of deionized water was reduced to 95.743 parts, and 0.037 part of a 20% solids polymethylmethacrylate (PMMA) bead solution was added. The PMMA beads used have an average diameter of 6 μm, with about 90% of the beads between 5.5 μm and 6.5 μm, and 0% greater than about 12 μm. The composition was coated, dried, and tested as in Example 1. The test results are shown in Table 3.

Example 3

A substrate was prepared and coated as in Example 2, except that the protective overcoating was dried at 180° F. (82° C.). Test results are shown in Table 3.

Comparative Example C1

A substrate was prepared as in Example 1 except that the protective overcoating composition was prepared by mixing 95.96 parts deionized water, 4 parts polyvinyl alcohol (AIRVOL 205), and 0.04 parts surfactant (TRITON DF-16). The composition was coated to a coating weight of 0.75 g/m$^2$ and dried at 49° C.

TABLE 3

| | Visual Rating After Aging With 5 Pound Weight | | | |
|---|---|---|---|---|
| Sheet | Example 1 | Example 2 | Example 3 | Example C1 |
| 1 | 2 | 2.5 | 2 | 1.5 |
| 2 | 2 | 2 | 1 | 1.5 |
| 3 | 1.5 | 1 | 0 | 1.5 |
| 4 | 1.5 | 0 | 0 | 1.5 |
| 5 | 1.5 | 0 | 0 | 1.5 |
| 6 | 1.5 | 0 | 0 | 1.5 |
| 7 | 1.5 | 0 | 0 | 1 |
| 8 | 1 | 0 | 0 | 1 |
| 9 | 0 | 0 | 0 | 1 |
| 10 | 0 | 0 | 0 | 0 |

The data in Table 3 show that the protective overcoatings of the invention are useful in reducing surface impressions when sheets are aged. All of the examples produced acceptably good image quality as compared to commercially viable metal label product.

Examples 4–7

Protective overcoating compositions were prepared with polyvinyl alcohol and styrene acrylic resins. Styrene acrylic resin solutions were prepared by dissolving the styrene acrylic resin (10 parts, either JONCRYL 67 or JONCRYL 690 styrene acrylic resins) in a 29% ammonium hydroxide solution (2.5 parts of this solution were used when JONCRYL 67 styrene acrylic resin was used and 2.2 parts of this solution were used when JONCRYL 690 styrene acrylic resin was used) and deionized water (87.5 parts) at 70° C. to form 10% solids styrene acrylic resin solutions.

A 2.5% solids 75/25 PVOH/SAR (polyvinyl alcohol/ styrene acrylic resin) composition was prepared by mixing a 7.5% solids solution of polyvinyl alcohol (25 parts, AIRVOL 205), the 10% solids styrene acrylic resin solution (6.24 parts), a 2% solids dispersion of PMMA beads (0.125 parts), and deionized water (68.66 parts).

A 2.5% solids 50/50 PVOH/SAR (polyvinyl alcohol/ styrene acrylic resin) composition was prepared by mixing a 7.5% solids solution of polyvinyl alcohol (16.64 parts, AIRVOL 205), the 10% solids styrene acrylic resin solution (12.48 parts), a 2% solids dispersion of PMMA beads (0.125 parts), and deionized water (70.75 parts).

A photosensitive sheet material was prepared by coating a 0.6 mm thick polyester film (ICI MELENEX 505 treated polyester film available from ICI America Inc., Wilmington, Del.) with a light blue photosensitive color solution described above, drying, and finally, overcoating with the protective coatings shown in Table 4 at a dry coating weight of 50 mg/ft$^2$ (539 mg/m$^2$). The coated constructions were tested for exposure latitude and resistance to humidity color blushing. Test results are shown in Table 4.

Comparative Example C2

A photosensitive sheet material was prepared as in Example 4, except that the protective coating composition was a 2.5% solids solution prepared using 7.5% solids solutions of polyvinyl alcohol (23.33 parts of AIRVOL 205 and 10 parts of AIRVOL 107), 2% solids dispersion of 2 μm PMMA beads (4.0 parts), and deionized water (62.67 parts). The solution was coated over the light blue photosensitive layer at a dry coating weight of 50 mg/ft$^2$ (539 mg/m2). The sample was tested for exposure latitude and resistance to humidity. The results are shown in Table 4.

TABLE 4

| | Example 4 | Example 5 | Example 6 | Example 7 | Example C2 |
|---|---|---|---|---|---|
| PVOH/SAR | 75/25 | 50/50 | 75/25 | 50/50 | 100/0 |
| SAR | JONCRYL 67 | JONCRYL 67 | JONCRYL 690 | JONCRYL 690 | — |
| Exposure Latitude (2% dot and 98% screen) | 0.5/0.5/0.5 | 1.0/0.5/1.0 | 1.0/0.5/1.0 | 0.5/0.5/0.5 | 0/1.0/0.5 |

TABLE 4-continued

|  | Example 4 | Example 5 | Example 6 | Example 7 | Example C2 |
| --- | --- | --- | --- | --- | --- |
| Centerpoint Exposure (sec) | 12, 12, 11 | 13, 14, 13 | 13, 12, 11 | 12, 10, 12 | —, 13, 12 |
| Grading (Blushing) | 2–3 | 1 | 0 | 0 | 6 |
| Optical Density | 2.66 | 2.72 | 2.71 | 2.69 | 1.69 |

The data in Table 4 show that the addition of an acrylic copolymer improves the moisture resistance (as measured by blushing or hazing of the photosensitive layer) of the protective overcoating without affecting the image quality. The data in Table 4 also show that the protective overcoating provides comparable exposure latitude and exposure times to a coating that has only an oxygen barrier.

Examples 8–10

A photosensitive polyester film sheet material was prepared as in Example 4 having a light blue photosensitive layer on the PET. The protective overcoat consisted of a first layer of polyvinyl alcohol containing PMMA beads (0.037 part of a 20% solids bead solution, as described in Example 2, per 100 parts of solution) coated to a dry coating weight of 539 mg/m$^2$. Coated on the polyvinyl alcohol layer was a layer of a styrene acrylic copolymer having dry coating weights of 280 mg/m$^2$, 161 mg/m$^2$, and 53.8 mg/m$^2$, for Examples 8, 9, and 10, respectively.

The polyvinyl alcohol solution was prepared by dissolving 1.75 parts AIRVOL 205 and 0.75 part AIRVOL 107 in 97.5 parts of deionized water. The styrene acrylic copolymer solution was prepared by dissolving 5 parts of JONCRYL 67 in 95 parts of methyl ethyl ketone. The constructions were tested for humidity blushing resistance and exposure latitude. The results are shown in Table 5.

Conparative Examples C3–C4

These examples were prepared as in Example 8, except that Example C3 had only the PVA coating at a dry coating weight of 539 mg/m$^2$, and Example C4 had only the styrene acrylic coating at a dry coating weight of 646 mg/m$^2$. Test results for exposure latitude and moisture resistance are shown in Table 5.

TABLE 5

| Example | 8 | 9 | 10 | C3 | C4 |
| --- | --- | --- | --- | --- | --- |
| Exposure Latitude (5% dot and 95% screen) | 2.0 | 2.0 | 2.0 | 2.0 | 1.0 |
| Centerpoint Exposure (sec) | 11.0 | 11.0 | 11.0 | 15.5 | 15.5 |
| Grading (Blushing) | 0 | 1 | 4* | 5 | — |

*Slight haze at the edges only.

The data in Table 5 show that a one-layer PVA protective overcoat gives good exposure latitude, but poor blushing resistance due to the inherent water sensitivity of PVA (Example C3), and a one-layer styrene acrylic copolymer protective overcoat (Example C4) gives poor image quality due to its high oxygen permeability relative to PVA. The two-layer protective overcoat (Examples 8–10) effectively reduces or prevents humidity blushing without detrimentally affecting image quality.

Examples 11–14

Photosensitive polyester film sheets were prepared as described in Example 4 except that the dark blue photosensitive solution shown in Table 2 was used. Protective overcoat compositions were prepared as described in Examples 4–7 using the polyvinyl alcohol resins (AIRVOL 205 and AIRVOL 107) and the styrene acrylic resins (JONCRYL 67 and JONCRYL 690) shown in Table 6. The overcoat compositions were prepared at 2.5% solids in water, and were coated using a #6 Meyer bar. The sheets were dried for about 3 minutes in a 175° F. (79° C.) oven, and the dry coating weight was about 539 milligrams per square meter. No polymeric beads were used. The sheets were tested for blocking according to the Blocking Test described above. The results are shown in Table 6.

Comparative Examples C5–C8

Sheets were prepared as in Examples 11–14 using only polyvinyl alcohol for examples C5–C6, and only styrene acrylic resins for examples C7–C8.

TABLE 6

| Example | Polyvinyl Alcohol parts by weight solids | | Styrene Acrylic Resin parts by weight solids | | Blocking Grade |
| --- | --- | --- | --- | --- | --- |
| | AIRVOL 205 | AIRVOL 107 | JONCRYL 67 | JONCRYL 690 | |
| 11 | 75 | — | 25 | — | 1.4 |
| 12 | 50 | — | 50 | — | 0.8 |
| 13 | 75 | — | — | 25 | 2.2 |
| 14 | 50 | — | — | 50 | 1.0 |
| C5 | 75 | 25 | — | — | 3.6 |
| C6 | 100 | — | — | — | 5.0 |
| C7 | — | — | 100 | — | 0.7 |
| C8 | — | — | — | 100 | 1.5 |

The data in Table 6 show that the compositions of the invention (Examples 11–14) are superior as they do not block during aging at elevated temperature and humidity, while still having good imaging qualities, as shown in Table 4.

While this invention has been described in connection with specific embodiments, it should be understood that it is capable of further modification. The claims herein are intended to cover those variations which one skilled in the art would recognize as the chemical equivalent of what has been described herein. Thus, various modifications to the principles described herein may be made by one skilled in the art without departing from the true scope and spirit of the invention which is indicated by the following claims.

What is claimed is:

1. A photoimageable element developable in an aqueous-based developing solution; the photoimageable element comprising:
   (a) a substrate;
   (b) a layer of a photosensitive composition comprising a photosensitive material coated on the substrate; and
   (c) a protective overcoating comprising an oxygen barrier component and a moisture resistant component; wherein the oxygen barrier component has an oxygen permeability of no greater than about $10^{-14}$ cc(cm)/cm²(sec)(Pa) and the protective overcoating is removable in an aqueous-based developing solution, and wherein the moisture resistant component comprises a carboxylated styrene acrylic resin.

2. The photoimageable element of claim 1 wherein the oxygen barrier component comprises polyvinyl alcohol.

3. The photoimageable element of claim 1 wherein the protective overcoating comprises one layer comprising a combination of the oxygen barrier component and the moisture resistant component.

4. The photoimageable element of claim 1 wherein the protective overcoating comprises a first layer comprising the oxygen barrier component and a second layer comprising the moisture resistant component; wherein the second layer is coated over the first layer.

5. The photoimageable element of claim 4 wherein the first layer further includes an antiblocking particulate material.

6. The photoimageable element of claim 4 wherein the second layer further includes an antiblocking particulate material.

7. The photoimageable dement of claim 1 wherein the protective overcoating further includes antiblocking particulate material.

8. The photoimageable element of claim 1 wherein the moisture resistant component comprises a polymeric material having a glass transition temperature of greater than about 35° C.

9. The photoimageable element of claim 8 wherein the moisture resistant component is selected from the group consisting of an acrylic polymer, an acrylic copolymer, a urethane resin, and a polyester resin.

10. The photoimageable element of claim 1 wherein the substrate is aluminum.

11. The photoimageable element of claim 1 wherein the substrate is polyester.

12. A photoimageable element comprising:

(a) a substrate;

(b) a layer of a photosensitive composition comprising a photosensitive material coated on the substrate; and (c) a protective overcoating comprising an oxygen barrier component, a moisture resistant component, and antiblocking particulate material; wherein the oxygen barrier component comprises polyvinyl alcohol and the moisture resistant component comprises styrene acrylic resin.

13. The photoimageable element of claim 12 wherein the protective overcoating comprises one layer comprising a combination of the oxygen barrier component, the moisture resistant component, and the antiblocking particulate material.

14. The photoimageable element of claim 12 wherein the protective overcoating comprises a first layer comprising the oxygen barrier component and the antiblocking particulate material, and a second layer comprising the moisture resistant component; wherein the second layer is coated over the first layer.

15. The photoimageable element of claim 12 wherein the protective overcoating comprises a first layer comprising the oxygen barrier component, and a second layer comprising the moisture resistant component and the antiblocking particulate material; wherein the second layer is coated over the first layer.

16. The photoimageable element of claim 12 wherein the antiblocking particulate material comprises polymethylmethacrylate beads.

17. The photoimageable element of claim 12 comprising a photolabel wherein the substrate is aluminum.

18. The photoimageable element of claim 12 comprising a proofing film wherein the substrate is polyester.

19. A photoimageable element comprising:

(a) a substrate;

(b) a layer of a photosensitive composition comprising a photosensitive material coated on a first side of the substrate;

(c) a protective overcoating comprising an oxygen barrier component, a moisture resistant component, and antiblocking particulate material; wherein the oxygen barrier component comprises polyvinyl alcohol and the moisture resistant component comprises styrene acrylic resin;

(d) a layer of a pressure sensitive adhesive coated on a second side of the substrate; and (e) a release liner covering the pressure sensitive adhesive.

20. The photoimageable element of claim 1 wherein the oxygen barrier component has an oxygen permeability of no greater than about $10^{-16}$ cc(cm)/cm²(sec)(Pa).

21. The photoimageable element of claim 1 wherein the oxygen barrier component has an oxygen permeability of about $10^{-16}$ cc(cm)/cm²(sec)(Pa) to about $10^{-18}$ cc(cm)/cm²(sec)(Pa).

* * * * *

UNITED STATES PATENT AND TRADEMARK OFFICE
CERTIFICATE OF CORRECTION

PATENT NO. : 5,597,677
DATED : January 28, 1997
INVENTOR(S) : Kangas et al.

It is certified that error appears in the above-identified patent and that said Letters Patent is hereby corrected as shown below:

Column 10,
Line 37, "aim" should read -- also --.

Column 11,
Line 7, "am" should read -- are --.

Column 12,
Line 6, "(see)" should read -- (sec) --.

Column 18,
Line 56, "mg/M2)" should read -- mg/m$^2$) --.

Column 19,
Line 37, "Conparative" should read -- Comparative --.

Column 21,
Line 23, "dement" should read -- element --.

Signed and Sealed this

Twenty-fifth Day of December, 2001

Attest:

JAMES E. ROGAN
*Attesting Officer*     *Director of the United States Patent and Trademark Office*